United States Patent [19]

Thiel

[11] Patent Number: 4,682,118
[45] Date of Patent: Jul. 21, 1987

[54] PHASE SHIFT KEYING AND PHASE MODULATION TRANSMISSION SYSTEM

[75] Inventor: David V. Thiel, Rochedale, Australia
[73] Assignee: Griffith University, Brisbane, Australia
[21] Appl. No.: 770,287
[22] PCT Filed: Dec. 19, 1984
[86] PCT No.: PCT/AU84/00262
  § 371 Date: Sep. 16, 1985
  § 102(e) Date: Sep. 16, 1985
[87] PCT Pub. No.: WO85/02966
  PCT Pub. Date: Jul. 4, 1985

[30] Foreign Application Priority Data
Dec. 22, 1983 [AU] Australia ............................... PG2964

[51] Int. Cl.⁴ ............................................. H03D 3/00
[52] U.S. Cl. ..................... 329/122; 331/17; 455/265
[58] Field of Search ................. 329/110, 122, 123; 455/255, 265; 331/17, 25

[56] References Cited

U.S. PATENT DOCUMENTS 3,454,904  7/1969  Clites et al. ............................ 332/16
3,761,820  9/1973  Nieson et al. ......................... 325/163
3,946,337  3/1976  Philips et al. ........................... 332/22
4,099,125  7/1978  Bennett, Jr. et al. ............ 329/122 X
4,345,219  8/1982  Jackson ............................ 331/1 A

FOREIGN PATENT DOCUMENTS 58-38053  3/1983  Japan .
2104746  3/1983  United Kingdom .

Primary Examiner—Eugene R. LaRoche
Assistant Examiner—Robert J. Pascal
Attorney, Agent, or Firm—Renner, Otto, Boisselle & Lyon

[57] ABSTRACT

A PSK and phase modulation transmission system has a modulator and a demodulator. The modulator has a carrier frequency generator (21) coupled to a voltage controlled phase shifter (22). The modulation of the signal in the shifter (22) is controlled by modulation voltage generator (23). A transmitter (24) receives the output from the shifter (22) and transmits the modulated signal. The demodulator (30) includes a receiver section (31) for receiving the signal transmitted by the transmitter (24). The receiver (31) is coupled to a modified phase locked loop comprising a phase detector (32), a low pass filter (33), a sample and a hold circuit (34) and a voltage controlled oscillator (35). A lock control circuit (36) receives either the output from the receiver (31) or the output from the filter (33) to produce a lock in pulse from changes in the received signal or changes in the demodulated signal at the filter (33) for controlling the sample and hold circuit (34).

6 Claims, 9 Drawing Figures

PHASE SHIFT KEYING AND PHASE MODULATION TRANSMISSION SYSTEM

This invention relates to a phase-shift-keying (P.S.K.) and phase modulation transmission system. In particular the invention concerns such a system which employs a P.S.K. modulation and a P.S.K. demodulation, the latter of which incorporates a novel phase-locked loop (P.L.L.).

BACKGROUND OF THE INVENTION

Phase-shift-keying for the transmission of binary or other signals has been shown to have advantages over other modulation techniques including a lower error rate in the presence of Gaussian noise. Its use in practice has been limited owing to the problems associated with the regeneration of the carrier at the point of reception and problems with phase-locked loop based demodulators. The latter problem has been resolved somewhat using a tan-locked loop. The former problem is related to the use of a 180 degree phase-shift for modulation to ensure waveform continuity in transmission.

Digitally controlled phase shifters usually rely on a P.L.L. technique in which various harmonics are generated. This allows phase-shifts to have values of m360/n degrees to be implemented (m is an integer and n is the harmonic number). While such techniques are adequate for P.S.K. generation, the frequency range of operation is limited by the lock-in range of the P.L.L. and the phase steps are large and discrete. It is more difficult to obtain values for n greater than 8 which results in a comparatively large modulation bandwidth.

A prime requirement of a P.S.K. demodulator is the regeneration of the carrier so that phase changes can be recorded without loss or ambiguity. This is particularly important when the P.S.K. transmission involves phase-shifts of 180 degrees. For any other phase-shift, one can make a decision about whether the shifted phase leads or lags the carrier from the magnitude of the phase-shift.

SUMMARY OF THE INVENTION

It is an object of the present invention to provide a transmission system including a modulator and demodulator which at least minimize the disadvantages of prior P.S.K. transmission systems including such effects as lock, ambiguity, false lock and relatively large transmission bandwidth.

The invention will be described in relation to its application for the transmission of binary digital data. It should be appreciated that this is by way of example only and that the invention may also be employed for the transmission of analog data and in combinations of digital modulation methods (e.g. multilevel phase-shift-keying). Also it should be appreciated that the invention may be employed both for the transmission of low and high frequency data, voice or other information.

For example, the invention may be employed for the transmission of data over at least a band of frequency extending from the audible end of the frequency spectrum to the radio frequency or microwave frequency end of the spectrum. The invention will be described by way of example with reference to the low frequency end of the spectrum.

The technique of the invention avoids potential ambiguity and preferably employs a modulation phase-shift of less that 180 degrees. The phase-shifted wave form may be generated digitally so that conversion to a sinusoidal form may incur a transition time. This transition time will be reduced by decreasing the value of the phase-shift. The demodulation technique of the invention functions well with existing P.S.K. generators.

The invention provides a phase demodulator including:

receiver means for receiving a modulated signal transmitted by a transmitter; and a modified phase locked loop adapted to receive the modulated signal from the receiver means, said phase locked loop including a phase detector for receiving the modulated signal, a low pass filter receiving an output from the phase detector, a voltage controlled oscillator providing a controlled input to the phase detector, a sample and hold circuit for receiving the output from the filter and providing a control signal for the voltage controlled oscillator and lock-in control means deriving a lock control signal from either the modulated signal or from the output of the filter or both to provide a lock-in control signal for the sample and hold circuit whereby in use when the lock-in control signal to the sample and hold circuit is high the phase locked loop locks onto the modulated signal and when the lock-in control signal is low the sample and hold circuit output is fixed independent of the filter output and if there is no change in the phase or frequency of the modulated signal the phase locked loop remains locked and the output of the sample and hold circuit approximates the output of the filter although the connection between the filter and sample and hold circuit is blocked and if a change in phase or frequency of the modulated signal occurs then the difference between the sample and hold circuit and the filter outputs is proportional to the phase or frequency shift in the modulated signal.

The invention also provides a phase modulator including:

a carrier frequency generator providing a carrier frequency signal;

a voltage controlled phase shifter receiving the carrier frequency;

a modulation signal generator adapted to control the phase shifter to modulate the carrier signal; and a transmitter for receiving the output of the phase shifter and transmitting that output.

The modulator of the transmission system of the invention includes a controlled phase-shifter. This phase-shifter may be digitally controlled. Where the shifter is intended for operation with digital data an input signal of frequency f is converted by the shifter into a series of spikes of frequency 2f. In one form of the invention the shifter comprises two portions coupled in parallel. One shifter portion receives positive going leading edges of the incoming signal and produces a narrow spike output whilst the other shifter portion receives negative going trailing edges of the incoming signal and produces a narrow spike output. The respective outputs of the shifter portions are combined to provide the 2f frequency signal mentioned above.

The shifter portions preferably are provided by one-shot multi-vibrators connected in parallel. The outputs of the one-shots may be combined in any suitable manner. Preferably these outputs are combined utilizing an exclusive OR gate (XOR).

The modulator of the invention further includes a controlled delay circuit. The controlled delay circuit receives the frequency converted signal 2f and delays the spikes of this signal by a predetermined amount. The delay circuit preferably includes delay components for providing the desired delay for the frequency converted input signal. The delay components may include a controllable RC circuit for receiving a control signal. Where the invention is operative for digital data signals, the control signal is a digital control signal.

The controllable RC circuit enables a variable delay to be produced for the frequency converted signal. Either component of the RC circuit may be variable to provide for the variable delay. Preferably the resistive component of the RC circuit is variable to provide for variable phase-shift control.

The controllable delay circuit includes a recognition circuit responsive to positive going edges of the frequency converted signal to provide an output pulse. The output of the recognition circuit may be a train of pulses whose width is governed by the control signal applied to the controlled delay circuit.

The resistor may be adjusted to allow any phase-shift between 0 and 180 degrees to be selected. The relationship between the phase-shift $\phi$ and the RC combination is linear i.e., $$\phi = 360 \, f \, t_{rc}$$

where f is the frequency of the signal and $t_{rc}$ is the time delay induced by the RC combination. The complete circuit is limited by the switching speed of the digital logic providing the width of the spike before the time delay is as short as possible.

The control signal may be provided by an open collector inverter which, when activated, alters the value of the resistance of the inverter. This resistance is additional to the resistance of the RC circuit. Hence the total resistance of the RC circuit is varied by the signal provided to the inverter.

The recognition circuit may also comprise a oneshot multi-vibrator although other components such as exclusive OR gates or flip flops may also be used.

The output of the controllable delay circuit is converted to a PSK output signal. This may be achieved by a flip flop. Preferably a JK flip flop is used.

The PSK output signal may be transmitted using any known transmission system. For example RF transmission techniques both open and closed may be employed for this purpose. If desired the PSK output signal may even be recorded on magnetic tape.

The invention includes a PSK demodulator. The demodulator of the invention comprises a modified phase-locked loop demodulator. The demodulator receives the PSK signal and includes a PLL. The PLL includes a phase detector, low pass filter (LPF) and a voltage controlled oscillator (VCO). These portions operate in known manner. The demodulator of the invention includes a sample and hold circuit (S/H) positioned between the LPF and the VCO in the PLL. The S/H receives a control signal or voltage.

The S/H may be a unity gain device although this is not essential. The demodulator includes a locking control circuit. This circuit derives one input from the PSK signal or from the demodulated output and is used to trigger or control the operation of the S/H. The lock-in control circuit also receives a locking signal. The two inputs to the lock-in control circuit ensure that this circuit functions to control the S/H. Any suitable criteria may be employed for the lock-in control circuit to provide the necessary control signal. For example, the circuit may be responsive to a start bit signal in the PSK signal and/or may provide a control signal only during periods of low noise. Other criteria will readily be apparent.

The modified PLL (i.e. one with an S/H) operates in a manner different from known PLL (including a PD, LPF and VCO) where the input signal is phase compared with the phase of an output from the VCO where the PD output is filtered (LPF) and becomes the control voltage for the VCO. In known PLL a frequency or phase shift in the input signal causes the phase detector output to vary until the VCO resumes its phase and frequency relationship with the input signal.

The modified PLL of the demodulator of the invention operates as follows: when the control voltage to the S/H is high, the S/H is transparent and the LPF output voltage is equal to the VCO input voltage and the loop behaves normally - i.e., the loop will lock on to the input signal. When the control voltage is low then the S/H output is fixed and independent of the LPF output. If there is no change in the phase or frequency of the input signal the PLL remains effectively locked and the output of S/H is approximately equal to the output from LPF, although the feedback path has been blocked. If, however, the phase of the input signal changes after the control voltage is set low, then the difference between the S/H output and the LPF output is proportional to the phase-shift of the input signal. Similarly, if the frequency of the input signal changes after the control voltage is set low, then the frequency of the output from LPF is equal to the difference in frequency between the VCO and the new input frequency (this assumes that the frequency is sufficiently low to pass the LPF).

In the demodulator of the invention, the PSK signal is applied to the phase detector (PD) of the PLL. Assuming the character transmitted is a start bit (logic low), and n bit character train where n is an integer, usually between 5 and 8, a parity bit and two stop bits (logic high), the lock-in controller LC may allow the VCO to lock in to the input signal using a pulse triggered from the transition from stop bits to start bit, or after a predetermined time interval.

This ensures that after each transmitted character the phase-locked loop is re-locked to the incoming frequency during the start bit. The VCO output becomes the regenerated carrier and all phase measurements are made relative to it. The control input to the VCO is held at this level by the S/H to maintain the same frequency and phase until the next stop-start transmission is received. Once the VCO has been set, the incoming data bits generate a phase difference for a logic high and no phase difference for a logic low. This can be monitored from the signal level output of the lowpass filter (LPF). An additional control line is required from the input to ensure that the S/H retains the precise voltage required as the LPF output always has a finite ripple. The only stability requirement is that the frequency and phase of the VCO does not drift between the start and end of a single transmitted character. At a data transmission rate of 300 baud for an 8 bit character, this time period is approximately 40 m sec. Typical VCO—S/H stabilities greatly exceed this. Of course, this time period decreases at high data transimission rates.

The lock-in control (LC) circuitry required can be initiated from a number of possible sources. The technique of using the stop-start transition to relock the loop is convenient for relocking the loop after a prolonged absence of data transmission. Equally efficient would be to use the data received pulse of a UART which converts the serial data to parallel data. For transmission paths where fading is a problem, then a simple level detector circuit could be used to control the relocking of the loop. The PLL however must be allowed sufficient time to lock the loop satisfactorily.

The voltage controlled oscillator (VCO) may be an integrated circuit oscillator controlled by a resistor and capacitor, a crystal oscillator, a klystron, or any other form of oscillator whose frequency is controlled by a voltage or current.

The phase detector (PD) may be a digital logic phase detector, a double balanced mixer configured for phase detection or any other form of linear or non-linear phase detector.

BRIEF DESCRIPTION OF THE DRAWINGS

Preferred embodiments of the invention for low frequencies will now be described with reference to the accompanying drawings in which.

DETAILED DESCRIPTION OF THE INVENTION

Figure 1:
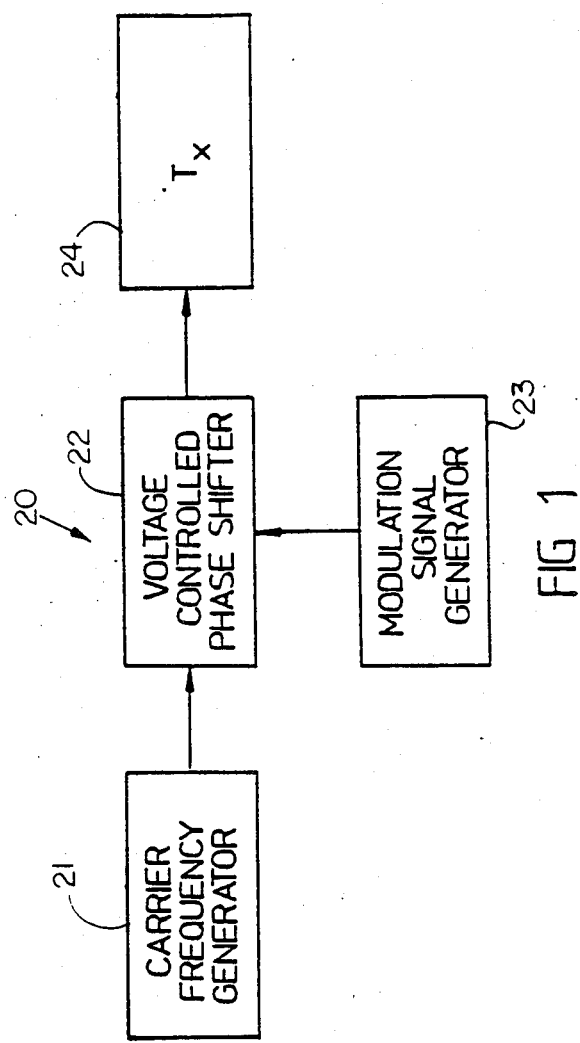
FIG. 1 is a block diagram of a preferred modulator of the invention.

FIG. 1 shows a basic block diagram of a modulator of the invention. The modulator 20 has a carrier frequency generator 21 coupled to a voltage controlled phase shifter 22. The modulation of the signal in the shifter 22 is controlled by modulation voltage generator 23. A transmitter 24 receives the output from shifter 22 and transmits the modulated signal.

Figure 2:
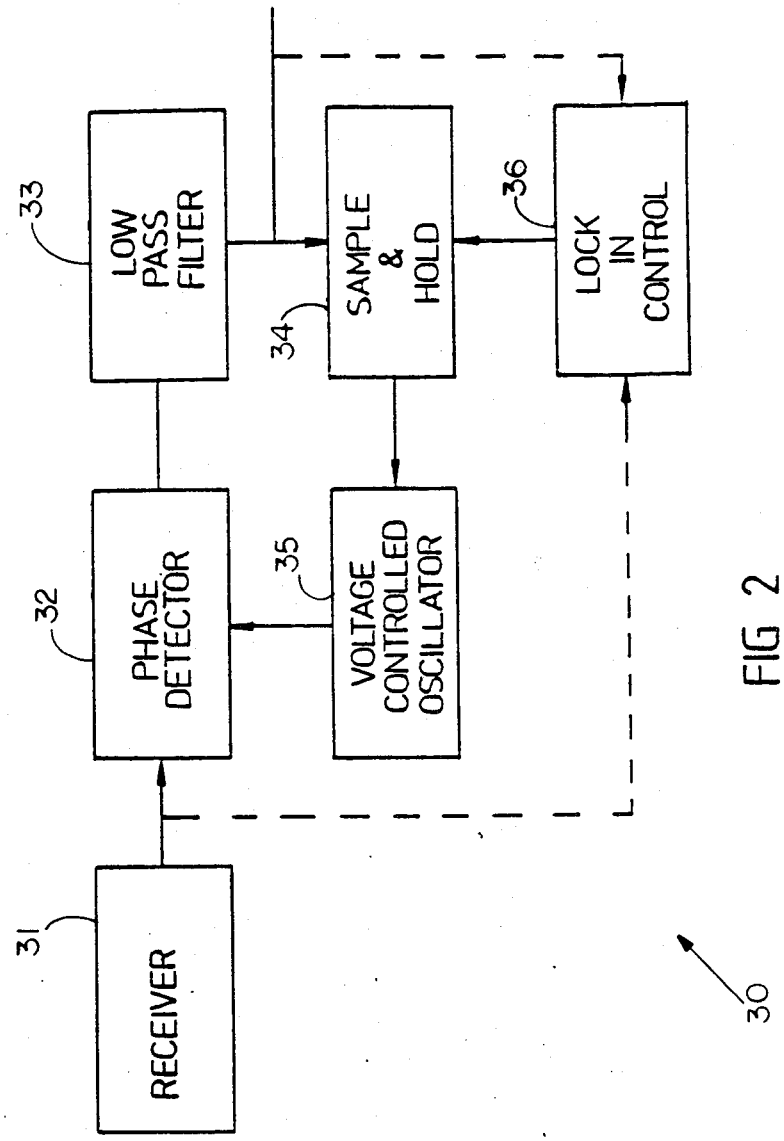
FIG. 2 is a block diagram of a preferred demodulator of the invention.

FIG. 2 shows a block diagram of a demodulator according to the invention. The demodulator 30 includes a received section 31 for receiving the signal transmitted by transmitter 24. The output from the receiver 31 is coupled to a modified phase locked loop (PLL) comprising a phase detector (PD) 32, a low pass filter 33, a sample and hold circuit (S/H) 34 and a voltage controlled oscillator (VCO) 35. A lock in control circuit 36 is positioned to receive either the output from the receiver 31 or the output from filter 33 or both to produce a lock-in-pulse (LIP) from changes in the received signal or changes in the demodulated signal at the filter for controlling the S/H 34. The PLL apart from the insertion of a S/H between the filter and VCO is a standard PLL circuit. A demodulated output 35 is available as an error signal or voltage Ve at the filter 33.

Figure 3:
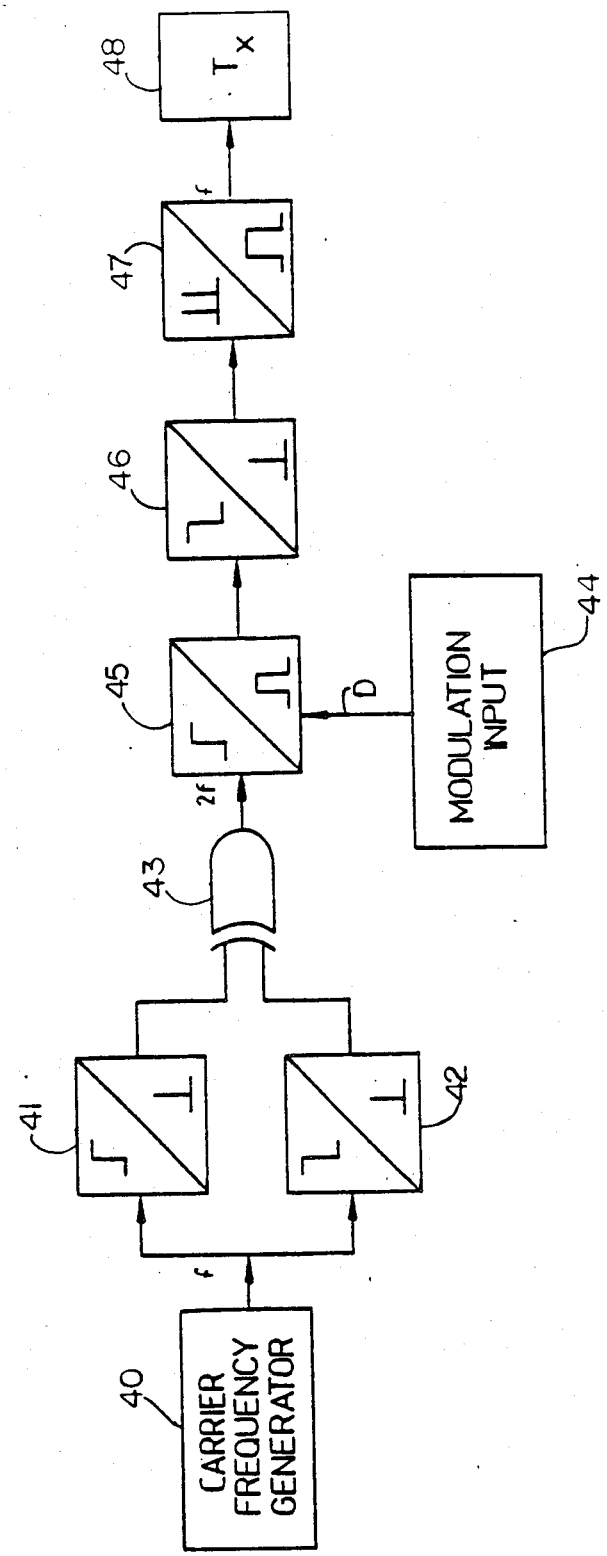
FIG. 3 is a block diagram of a preferred modulator for low frequency signals.

FIG. 3 shows a block diagram of a modulator suitable for analogue or digital communication. A carrier frequency generator 40 is arranged to provide an input or carrier signal of the required frequency.

The input or carrier signal f is applied to a parallel combination of circuits 41 and 42, responsive to positive and negative going edge portions of the carrier signal of frequency f to each produce narrow positive voltage spike outputs. These outputs are combined in an XOR circuit 43, which provides an output $2f$, twice the frequency of signal f. A modulation input circuit 44 provides digital or analogue information signal D as a phase control signal to circuit 45. Circuit 45 provides output pulses of controlled width, dependent upon the magnitude of the phase-shift provided. The output of circuit 45 is applied to circuit 46 which provides an output spike for each negative going trailing edge of the signal produced by circuit 45. The output from circuit 46 is applied to a pulse conditioning circuit 47 which provides an output change for each input spike. The output from 47 is a PSK output. This output is fed to transmitter 48 for transmission. Circuits 41,42,45 and 46 may all include one shot multi-vibrators whereas circuit 47 may be a JK flip flop.

Figure 4:
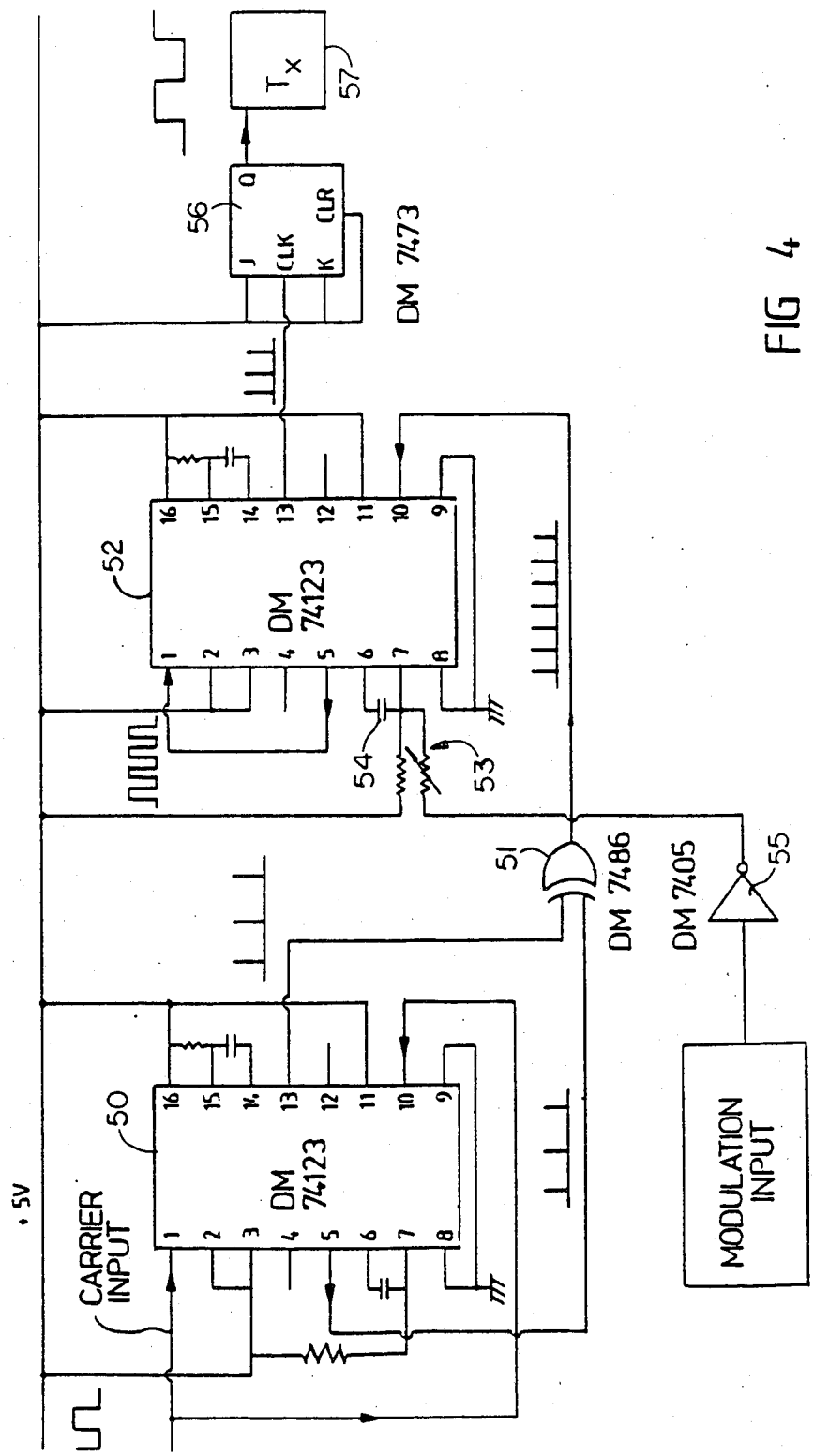
FIG. 4 is a circuit diagram of a preferred modulator for low frequency digital signals.

A particular form of modulator is shown in FIG. 4. The carrier input is applied to IC chip 50 comprising a dual package one shot DM74123. The outputs from chip 50 are coupled to XOR 51. XOR 51 may be a DM7486. The output from XOR 51 is coupled to an input of chip 52. Chip 52 also is a dual package on shot DM74123. One input to chip 52 is obtained via an RC network including resistor 53 and capacitor 54. The modulation, binary input or information is applied to resistor 53 via an open collector inverter 55. Inverter 55 may be a DM7405. The output from XOR is coupled to one input of chip 52. The output from chip 52 is coupled to the clock (CLK) input of JK flip flop 56. The flip flop 56 provides the PSK output at its Q terminal. Flip flop 56 may be a DM 7473. Devices 50,51,52,55 and 56 may be supplied with an operating voltage in the usual manner, as in known to those in the art.

Figure 5:
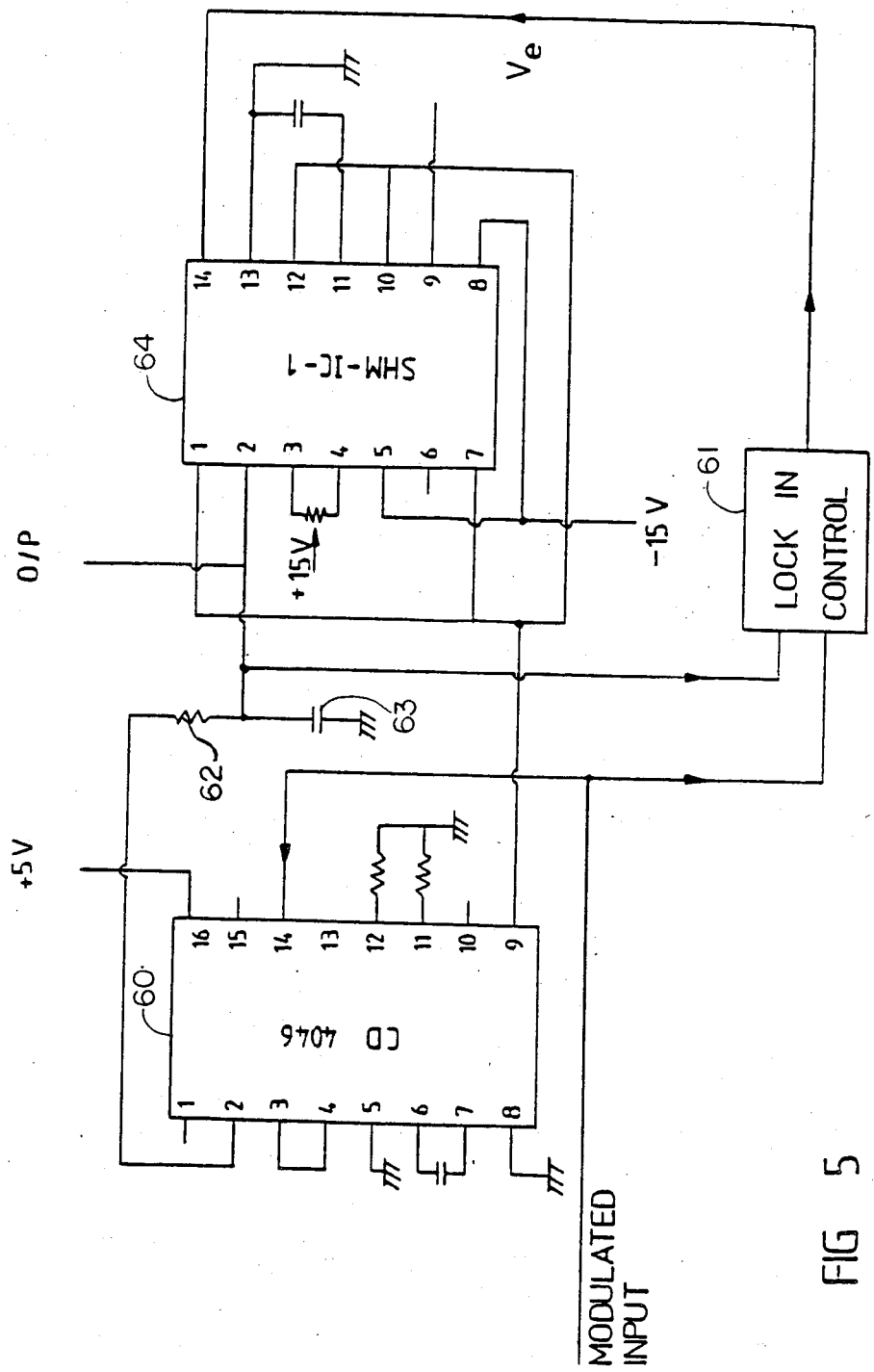
FIG. 5 is a circuit diagram of a preferred demodulator for low frequency signals.

A particular form of demodulator is shown in FIG. 5. This demodulator is suitable for digital communication. The PSK output (derived from transmitter 57 of FIG. 4) is supplied to phase-locked loop (PLL) 60 and to a lock-in control circuit 61. PLL may be a CD4046. Low pass filter(LPF) comprises series connected resistor 62 and capacitor 63 coupled between the output of PLL 60 and the input of sample and hold circuit (S/H) 64. The demodulated output appears at the junction between resistor 62 and capacitor 63. The digital control signal Ve is applied to a control input of S/H64. The signal Ve is obtained from lock-in control circuit 61. This control signal may be derived by control 61 either from variations in the modulated input signal or from the modulated output. In this figure both connections are shown although only one of them may be required. The control circuit 61 may comprise a series combination of a divide by 12 counter and a one shot. These may be devices DM7492 and DB74123 respectively. The one shot may have one input derived from the counter and the other via a variable resistor connected to a supply voltage. Devices 60,61 and 64 may be supplied with operating voltages in a manner known in the art.

Figure 6:
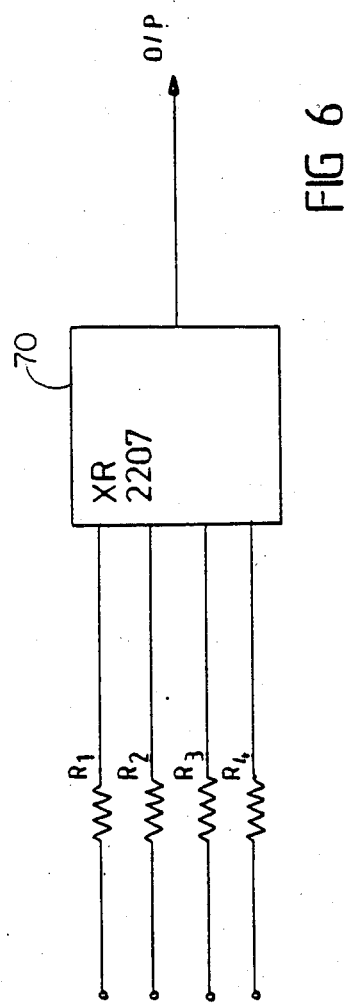
FIG. 6 shows a modification which may be used in the modulator shown in FIG. 1.

FIG. 6 shows a circuit useful in establishing a carrier frequency signal for spread spectrum communications. The circuit includes a programmable carrier frequency generator 70 having a plurality of inputs. The generator 70 may comprise device XR2207 and operates to provide a carrier of a particular frequency dependant upon a four bit digital input supplied to its inputs. The circuit of FIG. 6 may replace generator 40 of FIG. 3 or generator 21 of FIG. 1. With the circuit of FIG. 6 the carrier frequency is switched only when the data bit is low.

Figure 7:
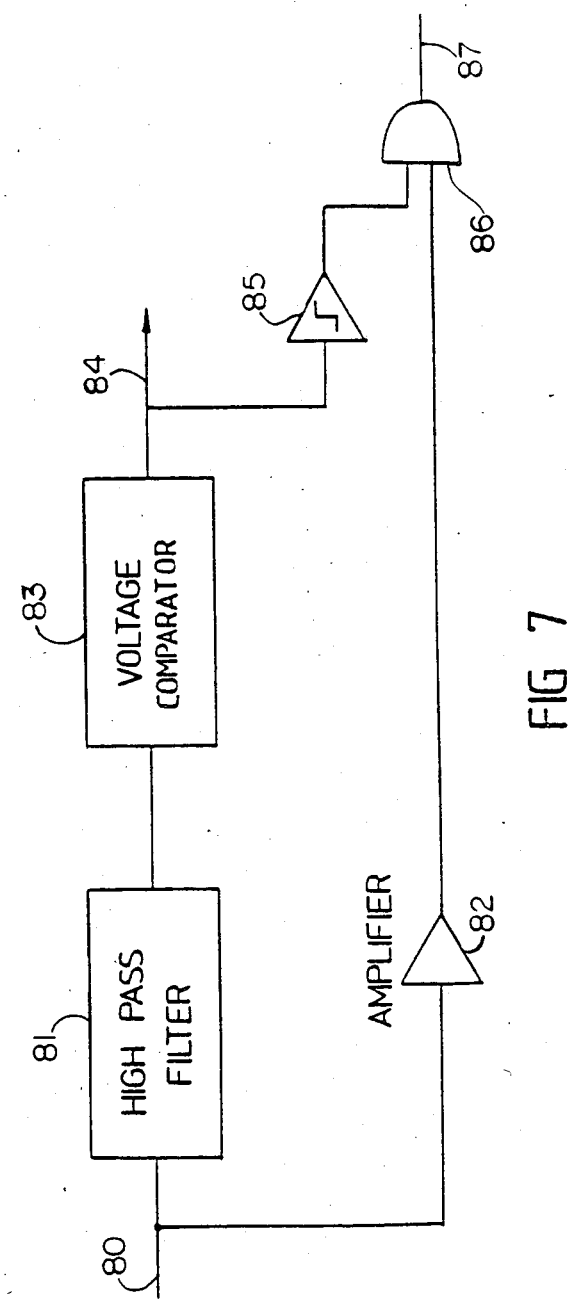
FIG. 7 shows a modification which may be used in the demodulator of FIG. 2.

FIG. 7 shows a circuit which may be employed to modify the circuits shown in FIGS. 2 and 5. The circuit of FIG. 7 has as input 80 coupled to a high pass filter 81 and to an amplifier 82. High pass filter 81 is coupled to a voltage comparator 83 which provides an output whenever its input exceeds a predetermined level. This output is available on line 84. The output is connected to a Schmitt trigger circuit 85 to provide a pulse in response to that output. The outputs from circuit 85 and amplifier 82 are provided as inputs to AND gate 86 when both inputs are high an output appears on line 87. The output from circuit 85 is used to disable AND gate 86. This circuit may form the lock in control of FIG. 2 by having line 80 coupled to the output of receiver 31 and line 84 coupled to S/H 34. At line 87 the demodulated output is available. Thus the circuit of FIG. 7 derives its lock in control from the received signal. If it is desired to derive the lock in control from the demodulated output line 80 may be coupled to the junction between the filter 33 and S/H34.

The circuit of FIG. 7 may replace lock in control circuit 61 of FIG. 5. This is achieved by deriving the signal Ve from line 84 and connecting line 80 to either receive the modulated input or connecting it to the junction between resistor 62 and capacitor 63. The demodulated output becomes available on line 87.

The lock-in control is required to separate frequency shifts from phase shifts. A frequency shift will produce a large phase detector output whereas modulation provides an output much lower than this. It is necessary to detect only large voltage transition using a voltage comparator. This output is used to allow the PLL to lock onto the new frequency and to blank out the output until this has been accomplished. The new demodulated output will not display any frequency change effects.

Figure 8:
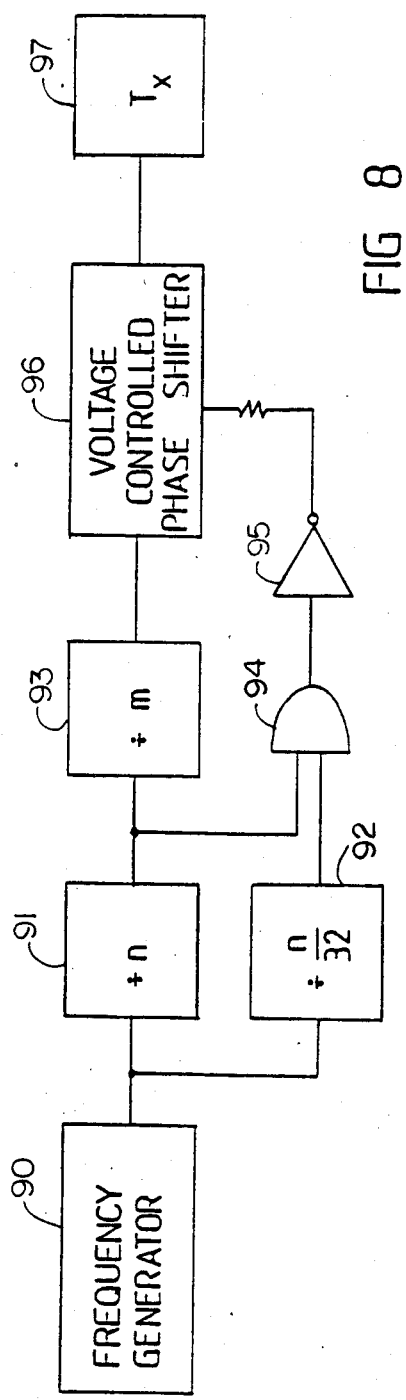
FIG. 8 shows a block diagram of another modulator according to an embodiment of the invention.

FIG. 8 shows a block diagram of a modulator useful for analogue communication. A carrier generator 90 is coupled to a divide by n circuit 91 and a divide by n/32 circuit 92 (hwere n is an integer). Circuit 91 is coupled to a further dividing circuit 93 which divides the carrier frequency by m (also an integer). These successive divisions are necessary because generator 90 supplies a signal whose frequency is much higher than that wanted. The output from circuits 91 and 92 form inputs to AND gate 94 which provides an output when both inputs are high. Gate 94 provides an input to open collector inverter 95. The output of inverter 95 provides a control input to voltage controlled phase shifter 96 to switch it off every n/32 pulses. Shifter 96 derives an input from counter 93. The output of shifter 96 is fed to a transmitter 97 for transmitting the modulated signal.

Figure 9:
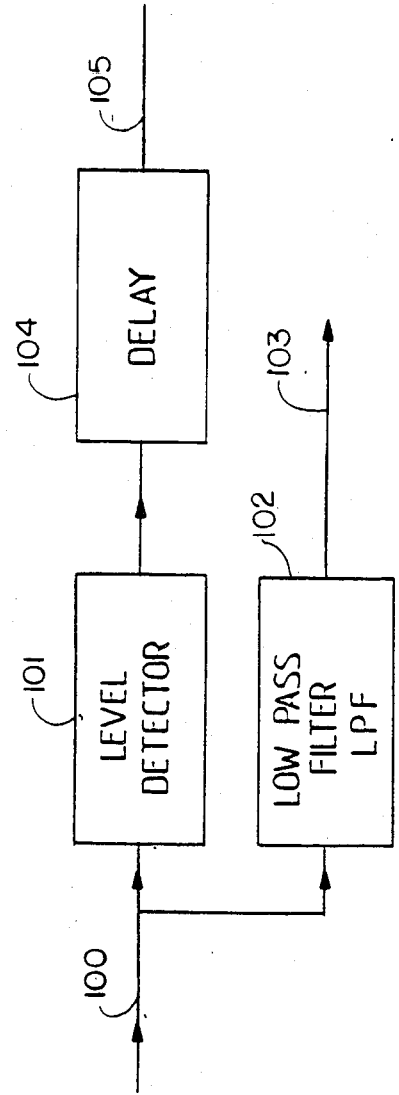
FIG. 9 shows a block diagram of a portion of a modified demodulator according to an embodiment of the invention.

FIG. 9 shows a portion of a demodulator which is useful in a demodulator for analogue communications. The block diagram shows an input line 100 which may be the demodulated output provided by the filter 33 of FIG. 2. This input is coupled to a level detector 101 and a low pass filter 102. The analogue demodulated output is available on line 103. A delay circiut 104 is coupled to detector 101 and has an output line 105. This circuit may be interposed between filter 33 with line 100 receiving the output from the filter and line 105 coupled to S/H 34.

The PSK demodulator of the invention in general is capable of regenerating the carrier and decoding any phase-shift magnitude including both leading or lagging phase-shifts and will also decode PSK signal which employ a 180 degree phase-shift modulation. The demodulator is capable of recovering from delays in character transmission and performance improves with data transmission speed. The ability to recover from a transmission delay is governed by the long term stability of the VCO - S/H combination.

It may also be possible to select the best portion of a noisy transmission to set the VCO, thus obtaining improved noise immunity and the maintenance of phase information during periods of low signal to noise ratio. Further, it may be possible to monitor short period phase fluctuations without the need for highly stable local frequency reference.

Applications for such technique include coherent radar receiving systems, phase navigation systems, spread spectrum digital communications and for regenerating a carrier wave signal from a pulsed input waveform.

The regeneration of a CW signal from a pulsed input waveform is possible using the demodulation technique of the invention. This has applications in phase navigation systems and in the synthesis of a number of continuous, phase related signals from a single programmable frequency synthesiser. Of particular interest is the possiblity of making frame by frame phase difference measurements on the 13.0 kHz Omega signal. This would allow pseudo-absolute phase measurements to be made without the use of a local atomic frequency standard. The technique is simply to monitor the phase difference between the VCO and the next frame before relocking the phase locked loop. Such a technique gains stability from the stability of the source and the short term (i.e. from one frame to the next) stability of the VCO. By tracking the phase difference between one frame and the next, the appropriate correction can be calculated and the frequency standard regenerated at the receiver site. There are of course limitations but their effect must be examined experimentally.

In spread spectral Digital communications, control over when the phase locked loop is locked onto the incoming signal, can be determined by the extent of the frequency shift of an incoming signal. If the phase locked loop has a relatively large capture range, then its response to an PSK signal in which the centre frequency changes randomly, can be decoded as either data (for small frequency shift) or centre frequency change (for larger frequency shift). The phase locked loop PSK demodulator circuit is able to decode such a waveform without error in the data sequence.

The demodulation technique of the invention has applications in the design of coherent radar receivers. In particular, it should be possible for bistatic systems to use the primary pulse to set their phase reference and then use it to determine the phase of the incoming echoes. Thus the receiver could operate independently of the transmitter site. In over-the-horizon radars using a one or two hop propagation path, it should be possible to use the echo from a fixed object as a phase reference thus eliminating effects of ionospheric movements. If this is combined with a spread spectrum capability discussed in (2) then there may be some advantages in using portable or fixed radar receivers located much closer to the target area in a radar system.

It should be noted that PLL's are used throughout the electro-magnetic spectrum from low frequencies to 20 GHz and that the demodulation technique of the invention can be applied throughout this spectral range.

The modified phase locked loop could be incorporated in a single 14 pin integrated circuit.

It should be appreciated that many changes, modifications or additions may be made to the above without departing from the spirit or scope of the invention.

What is claimed is:

1. A phase demodulator including:

a receiver means for receiving a modulated signal transmitted by a transmitter; and a modified phase locked loop adapted to receive the modulated signal from the receiver means, said phase locked loop including a phase detector for receiving the modulated signal, a low pass filter receiving an output from the phase detector, a voltage controlled oscillator providing a controlled input to the phase detector, a sample and hold circuit for receiving the output from the filter and providing a control signal for the voltage controlled oscillator and lock-in control means deriving a lock control signal from at least one of the modulated signals and the output of the filter to provide a lock-in control signal for the sample and hold circuit whereby in use when the lock-in control signal to the sample and hold circuit is high the phase locked loop locks onto the modulated signal and when the lock-in control signal is low the sample and hold circuit output is fixed independent of the filter output and if there is no change in the phase or frequency of the modulated signal the phase locked loop remains locked and the output of the sample and hold circuit approximates the output of the filter although the connection between the filter and sample and hold circuit is blocked and if a change in phase or frequency of the modulated signal occurs then the difference between the sample and hold circuit and the filter outputs is proportional to the phase or frequency shift in the modulated signal, and said lock-in control means including a divider and one shot in series, said divider receiving the modulated signal and the output of the one shot providing the lock-in control signal.

2. A phase demodulator including:

a receiver means for receiving a modulated signal transmitted by a transmitter; and a modified phase locked loop adapted to receive the modulated signal from the receiver means, said phase locked loop including a phase detector for receiving the modulated signal, a first low pass filter receiving an output from the phase detector, a voltage controlled oscillator providing a controlled input to the phase detector, a sample and hold circuit for receiving the output from the first filter and providing a control signal for the voltage controlled oscillator and lock-in control means deriving a lock control signal from at least one of the modulated signal and the output of the first filter to provide a lock-in control signal for the sample and hold circuit whereby in use when the lock-in control signal to the sample and hold circuit is high the phase locked loop locks onto the modulated signal and when the lock-in control signal is low the sample and hold circuit output is fixed independent of the first filter output and if there is no change in the phase of frequency of the modulated signal the phase locked loop remains locked and the output of the sample and hold circuit approximates the output of the first filter although the connection between the first filter and sample and hold circuit is blocked and if a change in phase or frequency of the modulated signal occurs then the difference between the sample and hold circuit and the first filter outputs is proportional to the phase or frequency shift in the modulated signal, and said lock-in control means including a level detector, a delay circuit coupled to receive the output from the level detector, the output of the dealy circuit providing the lock-in control signal for the sample and hold circuit, a second low pass filter coupled to the input of the level detector and the output of which is the demodulated signal.

3. A phase demodulator including:

a receiver means for receiving a modulated signal transmmitted by a transmitter; and a modified phase locked loop adapted to receive the modulated signal from the receiver means, said phase locked loop including a phase detector for receiving the modulated signal, a low pass filter receiving an output from the phase detector, a voltage controlled oscillator providing a controlled input to the phase detector, a sample and hold circuit for receiving the output from the filter and providing a control signal for the voltage controlled oscillator and lock-in control means deriving a lock control signal from at least one of the modulated signal and the output of the filter to provide a lock-in control signal for the sample and hold circuit whereby in use when the lock-in control signal to the sample and hold circuit is high the phase locked loop locks onto the modulated signal and when the lock-in control signal is low the sample and hold circuit output is fixed independent of the filter output and if there is no change in the phase or frequency of the modulated signal the phase locked loop remains locked and the output of the sample and hold circuit approximates the output of the filter although the connection between the filter and sample and hold circuit is blocked and if a change in phase or frequency of the modulated signal occurs then the difference between the sample and hold circuit and the filter outputs is proportional to the phase or frequency shift in the modulated signal, and said lock-in control means including a high pass filter, a voltage comparator coupled to the output of the high pass filter, the output of the comparator providing the lock-in control signal for the sample and hold circuit and an input to a trigger circuit, an amplifier receiving the input to the high pass filter, and AND gate receiving the output from the trigger circuit and the amplifier to provide a demodulated output whereby the trigger circuit disables the output of the AND gate when a frequency shift is detected by the voltage comparator.

4. A demodulator according to claim 3 wherein said lock in control means derives its lock-in control signal from the modulated input.

5. A transmission system including a demodulator according to any one of claims 1 and 4 and a modulator, said modulator including a carrier frequency generator providing a carrier frequency signal, a voltage controlled phase shifter receiving the carrier frequency and providing an output whose phase is proportional to the magnitude of an applied voltage; a modulation signal generator adapted to control the phase shifter to modulate the carrier signal, and a transmitter for receiving the output of the phase shifter and transmitting that output.

6. A transmission system as set forth in claim 5 wherein said controlled phase shifter comprises a frequency doubler, a pulser width circuit providing an output pulse of a width dependent upon the signal from the modulation generator, a pulse conditioning means for receiving the output from the pulse width circuit and providing a pulse for each negative going trailing edge of the output signal of the pulse width circuit.

* * * * *